US011327259B2

(12) United States Patent
Li et al.

(10) Patent No.: US 11,327,259 B2
(45) Date of Patent: May 10, 2022

(54) INTEGRATED CIRCUIT PACKAGE WITH ELECTRO-OPTICAL INTERCONNECT CIRCUITRY

(71) Applicant: Intel Corporation, Santa Clara, CA (US)

(72) Inventors: Peng Li, Palo Alto, CA (US); Joel Martinez, Hayward, CA (US); Jon Long, Scotts Valley, CA (US)

(73) Assignee: Intel Corporation, Santa Clara, CA (US)

( * ) Notice: Subject to any disclaimer, the term of this patent is extended or adjusted under 35 U.S.C. 154(b) by 1139 days.

(21) Appl. No.: 15/835,177

(22) Filed: Dec. 7, 2017

(65) Prior Publication Data
US 2019/0041594 A1 Feb. 7, 2019

(51) Int. Cl.
*G02B 6/43* (2006.01)
*H01L 23/498* (2006.01)
(Continued)

(52) U.S. Cl.
CPC .......... *G02B 6/43* (2013.01); *H01L 23/49816* (2013.01); *H01L 23/49827* (2013.01); *H01L 23/49833* (2013.01); *H01L 23/5385* (2013.01); *H01L 24/14* (2013.01); *H01L 24/48* (2013.01); *H01L 24/81* (2013.01); *H01L 25/0655* (2013.01); *H04B 10/40* (2013.01); *H01L 24/13* (2013.01); *H01L 24/16* (2013.01);
(Continued)

(58) Field of Classification Search
CPC ................ G02B 6/43; H01L 23/49816; H01L 23/49827; H01L 23/49833
See application file for complete search history.

(56) References Cited

U.S. PATENT DOCUMENTS 6,789,959 B1 * 9/2004 Conn ................... G02B 6/3897
385/100
6,945,712 B1 * 9/2005 Conn ................... G02B 6/4246
385/94
(Continued)

FOREIGN PATENT DOCUMENTS

WO        02063800 A1    8/2002
WO    2014014846 A2    1/2014

OTHER PUBLICATIONS

Extended European Search Report for EP Application No. 18204765.4 dated May 3, 2019.
(Continued)

*Primary Examiner* — David P Porta
*Assistant Examiner* — Djura Malevic
(74) *Attorney, Agent, or Firm* — Fletcher Yoder, PC

(57) ABSTRACT

A multichip package may include at least a package substrate, a main die mounted on the package substrate, a transceiver die mounted on the package substrate, and an optical engine die mounted on the package substrate. The main die may communicate with the transceiver die via a first high-bandwidth interconnect bridge embedded in the package substrate. The transceiver die may communicate with the optical engine die via a second high-bandwidth interconnect bridge embedded in the package substrate. The transceiver die has physical-layer circuits that directly drive the optical engine. An optical cable can be connected directly to the optical engine of the multichip package.

20 Claims, 7 Drawing Sheets

(51) Int. Cl.
*H01L 23/538* (2006.01)
*H01L 23/00* (2006.01)
*H01L 25/065* (2006.01)
*H04B 10/40* (2013.01)

(52) U.S. Cl.
CPC .............. *H01L 2224/13101* (2013.01); *H01L 2224/1403* (2013.01); *H01L 2224/16225* (2013.01); *H01L 2924/10253* (2013.01); *H01L 2924/15311* (2013.01); *H01L 2924/3511* (2013.01)

(56) References Cited

U.S. PATENT DOCUMENTS

| | | | | |
|---|---|---|---|---|
| 8,546,955 | B1 * | 10/2013 | Wu | H01L 25/0652 |
| | | | | 257/777 |
| 8,588,561 | B2 * | 11/2013 | Zbinden | G02B 6/4284 |
| | | | | 385/14 |
| 8,588,562 | B2 * | 11/2013 | Zbinden | G02B 6/4249 |
| | | | | 385/14 |
| 8,787,711 | B2 * | 7/2014 | Zbinden | G02B 6/4249 |
| | | | | 385/14 |
| 9,002,155 | B2 * | 4/2015 | Li | G02B 6/4292 |
| | | | | 385/14 |
| 9,184,850 | B2 * | 11/2015 | Aronson | G01M 11/30 |
| 9,374,165 | B2 * | 6/2016 | Zbinden | G02B 6/4279 |
| 9,438,355 | B2 * | 9/2016 | Blumenthal | H04B 10/0793 |
| 9,577,759 | B2 * | 2/2017 | Aronson | G01M 99/002 |
| 9,651,752 | B2 * | 5/2017 | Zbinden | G02B 6/4293 |
| 9,671,572 | B2 * | 6/2017 | Decker | G02B 6/4204 |
| 9,835,811 | B2 * | 12/2017 | Zbinden | H01R 12/716 |
| 9,841,572 | B2 * | 12/2017 | Zbinden | G02B 6/4249 |
| 9,915,796 | B2 * | 3/2018 | Zbinden | G02B 6/4246 |
| 9,915,797 | B2 * | 3/2018 | Zbinden | H01R 12/716 |
| 10,436,992 | B2 * | 10/2019 | Zbinden | G02B 6/428 |
| 10,530,614 | B2 * | 1/2020 | Wu | H04L 25/03114 |
| 10,965,439 | B2 * | 3/2021 | Sun | H04B 10/506 |
| 10,965,501 | B2 * | 3/2021 | Wu | H04L 25/03114 |
| 2002/0154082 | A1 * | 10/2002 | Zavracky | G06F 1/1662 |
| | | | | 345/88 |
| 2002/0158823 | A1 * | 10/2002 | Zavracky | G06F 1/1686 |
| | | | | 345/87 |
| 2003/0053170 | A1 | 3/2003 | Levinson et al. | |
| 2007/0258551 | A1 | 11/2007 | Sefidvash et al. | |
| 2008/0292322 | A1 * | 11/2008 | Daghighian | H04B 10/40 |
| | | | | 398/192 |
| 2009/0116845 | A1 | 5/2009 | Li et al. | |
| 2013/0148973 | A1 * | 6/2013 | Zbinden | G02B 6/4292 |
| | | | | 398/115 |
| 2013/0236186 | A1 * | 9/2013 | Zbinden | G02B 6/428 |
| | | | | 398/115 |
| 2014/0286646 | A1 * | 9/2014 | Zbinden | H04B 10/25891 |
| | | | | 398/135 |
| 2015/0220472 | A1 * | 8/2015 | Sengoku | G06F 13/4068 |
| | | | | 375/340 |
| 2015/0365177 | A1 * | 12/2015 | Blumenthal | H04B 10/0793 |
| | | | | 398/9 |
| 2016/0065309 | A1 * | 3/2016 | Aronson | G01M 99/002 |
| | | | | 398/25 |
| 2016/0085038 | A1 * | 3/2016 | Decker | G02B 6/428 |
| | | | | 385/14 |
| 2016/0142155 | A1 | 5/2016 | Kim | |
| 2016/0291274 | A1 * | 10/2016 | Zbinden | H04B 10/40 |
| 2016/0327760 | A1 * | 11/2016 | Zbinden | G02B 6/4279 |
| 2016/0327761 | A1 * | 11/2016 | Zbinden | G02B 6/4293 |
| 2017/0003465 | A1 * | 1/2017 | Zbinden | G02B 6/4261 |
| 2017/0163346 | A1 * | 6/2017 | Aronson | G01M 99/002 |
| 2017/0194309 | A1 | 7/2017 | Evan et al. | |
| 2017/0219788 | A1 * | 8/2017 | Zbinden | G02B 6/4246 |
| 2017/0294906 | A1 * | 10/2017 | Wagh | H03L 9/00 |
| 2017/0346617 | A1 * | 11/2017 | Bandi | H04L 7/0008 |
| 2019/0089520 | A1 * | 3/2019 | Dvir | H04L 7/0079 |
| 2019/0149154 | A1 * | 5/2019 | Patil | G06F 1/04 |
| | | | | 375/359 |
| 2020/0003976 | A1 * | 1/2020 | Zbinden | G02B 6/4261 |

OTHER PUBLICATIONS

Communication Pursuant to Article 93(3) EPC for EP Application No. 18204765.4 dated Jan. 25, 2021.

Ravi Mahajan et al., "Embedded Multi-Die Interconnect Bridge (EMIB)—A High Density, High Bandwidth Packaging Interconnect," 2016 IEEE 66th Electronic Components and Technology Conference, pp. 557-565.

Chenhui Li et al., "Chip Scale 12-Channel 10 Gb/s Optical Transmitter and Receiver Subassemblies Based on Wet Etched Silicon Interposer," Journal of Lightwave Technology, vol. 35, No. 15, Aug. 1, 2017, pp. 3229-3236.

* cited by examiner

INTEGRATED CIRCUIT PACKAGE WITH ELECTRO-OPTICAL INTERCONNECT CIRCUITRY

BACKGROUND

This relates generally to integrated circuits, and more particularly, to integrated circuit components for supporting high bandwidth communication.

Computing systems such as cloud computing systems or data centers that are used for hosting, storing, or conveying large amounts of data typically include many high-performance computing devices interconnected to one another. A typical computing device includes a printed circuit board, an integrated circuit die mounted on the printed circuit board and a separate optical module mounted on the printed circuit board. An external optical cable is connected to the optical module to connect the integrated circuit die to the rest of the system.

Data is transferred between the integrated circuit die and the optical module using package traces formed on the printed circuit board. State of the art computing systems may have high bandwidth requirements, with communications exceeding 10 Gigabit per second (Gbps), 100 Gbps, or even 400 Gbps, either per lane, or aggregated. The package traces on the printed circuit board connecting the integrated circuit die to the optical module are, however, not optimized for high bandwidth density and low power. As a result, power dissipation poses a significant problem with such types of package-level interconnects (i.e., a large percentage of power in data centers, wireless applications, and other high-performance computing systems are due to interconnect power).

It is within this context that the embodiments described herein arise.

DETAILED DESCRIPTION

The present embodiments relate to integrated circuits, and more particularly, to a multichip package that includes a main integrated circuit die and an electro-optical tile. The electro-optical tile may include a transceiver and an optical engine, which eliminates the conventional chip-to-module interconnect. Configured in this way, the power consumption can be greatly reduced while supporting high bandwidth interconnect density.

It will be recognized by one skilled in the art, that the present exemplary embodiments may be practiced without some or all of these specific details. In other instances, well-known operations have not been described in detail in order not to unnecessarily obscure the present embodiments.

Figure 1:
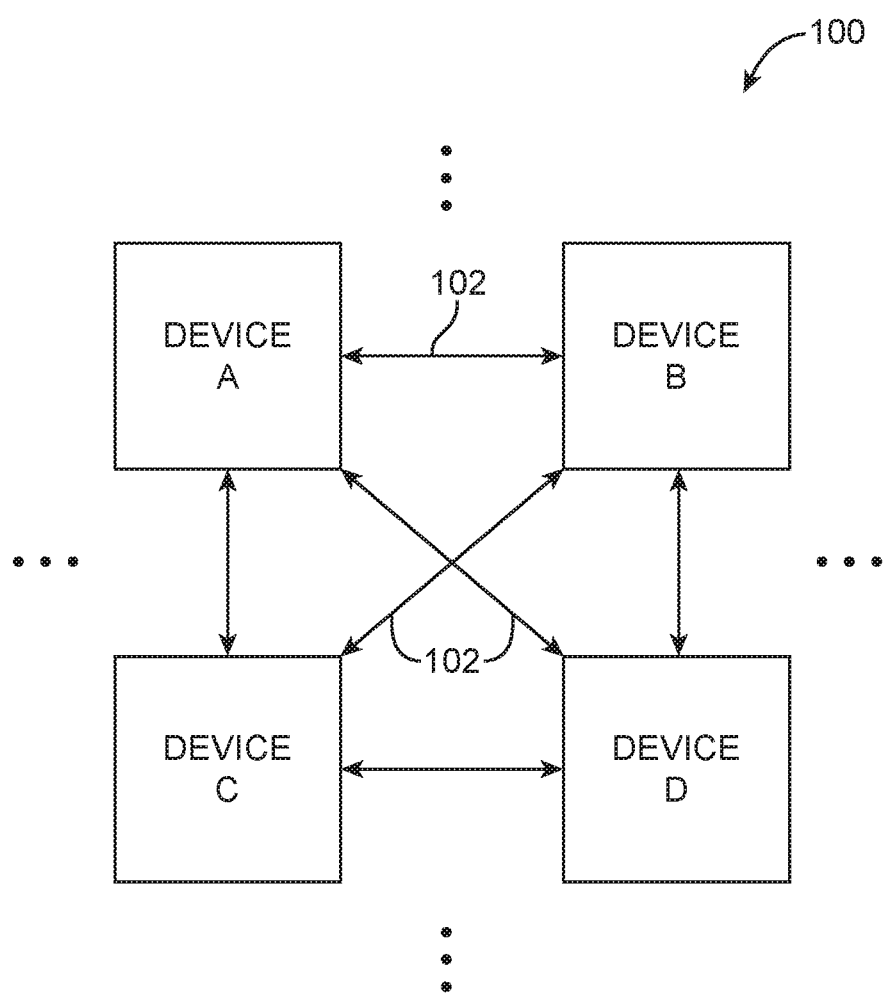
FIG. 1 is a diagram of illustrative interconnected electronic devices that may communicate with one another via serial data links in accordance with an embodiment.

An illustrative system 100 of interconnected electronic devices is shown in FIG. 1. The system of interconnected electronic devices may have multiple electronic devices such as device A, device B, device C, device D, and interconnection resources 102. The electronic devices A-D may be any suitable type of electronic device that communicates with other electronic devices. Examples of such electronic devices include basic electronic components and circuits such as analog circuits, digital circuits, optical circuits, mixed-signal circuits, etc. Examples of such electronic devices also include complex electronic systems such as data centers, network routers, cellular base stations, or parts thereof that communicate with each other over wired or wireless networks.

Interconnection resources 102 may include conductive lines and busses, optical interconnect infrastructure, and/or wired and wireless networks with optional intermediate switching circuitry may be used to send signals from one electronic device to another electronic device or to broadcast information from one electronic device to multiple other electronic devices. For example, a transmitter in device B may transmit serialized data signals at a given transmission rate as a data stream over a serial communication link 102 to a receiver in device C. Similarly, device C may use a transmitter to transmit serialized data signals as a data stream over a serial communication link 102 to a receiver in device B.

If desired, multiple serial communication links may be used to transmit data. For example, multiple transmitters in a transmitting device may each transmit a portion of the data as serial data streams over multiple serial communication links or "channels" to multiple receivers in a receiving device. Upon reception, receiver circuitry in the receiving device may restore the data by aggregating portions from the different channels received at the multiple receivers. The aggregated data may then be stored by memory circuit on the receiving device or processed and retransmitted to another device.

As integrated circuit fabrication technology scales towards smaller processing nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within a single package. Such types of packages that contain multiple interconnected dies may sometimes be referred to as systems-in-package (SiPs), multichip modules (MCM), or multichip packages (MCP). Placing multiple chips (dies) into a single package may allow each die to be implemented using the most appropriate or optimal technology process (e.g., a core logic chip may be implemented using one technology node, whereas a memory chip may be implemented using another technology node) and may help increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multi-chip package is mounted during normal system operation).

Figure 2:
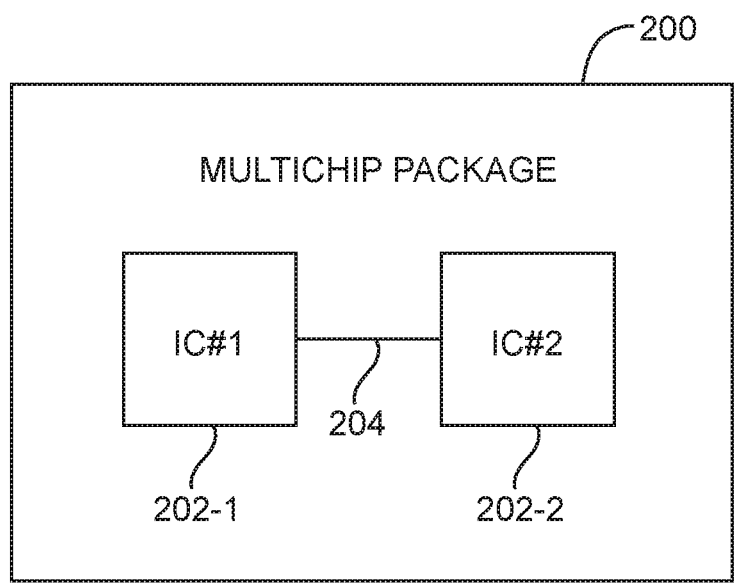
FIG. 2 is a diagram of an illustrative multichip package with multiple integrated circuit dies in accordance with an embodiment.

FIG. 2 is a diagram of an illustrative multichip package 200 that includes multiple integrated circuit (IC) dies including at least a first IC die 202-1 and a second IC die 202-2. The integrated circuit dies on package 200 may be any suitable integrated circuit such as programmable logic devices, application specific standard products (ASSPs), application specific integrated circuits (ASICs), transceiver dies, optical engine dies, memory dies, etc. Examples of programmable logic devices include programmable array logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

As shown in FIG. 2, package 200 may include interconnect paths 204 (e.g., conductive signal traces formed on a substrate in multichip package 200) that connect die 202-1 to die 202-2. Configured in this way, dies 202-1 and 202-2 may communicate with one another by sending control and data signals via paths 204. The example of FIG. 2 in which multichip package 200 includes two integrated circuit dies is merely illustrative. In general multichip package 200 may include three or more dies, four or more dies, or any desired number of chips stacked laterally with respect to one another or stacked on top of one another.

Figure 3:
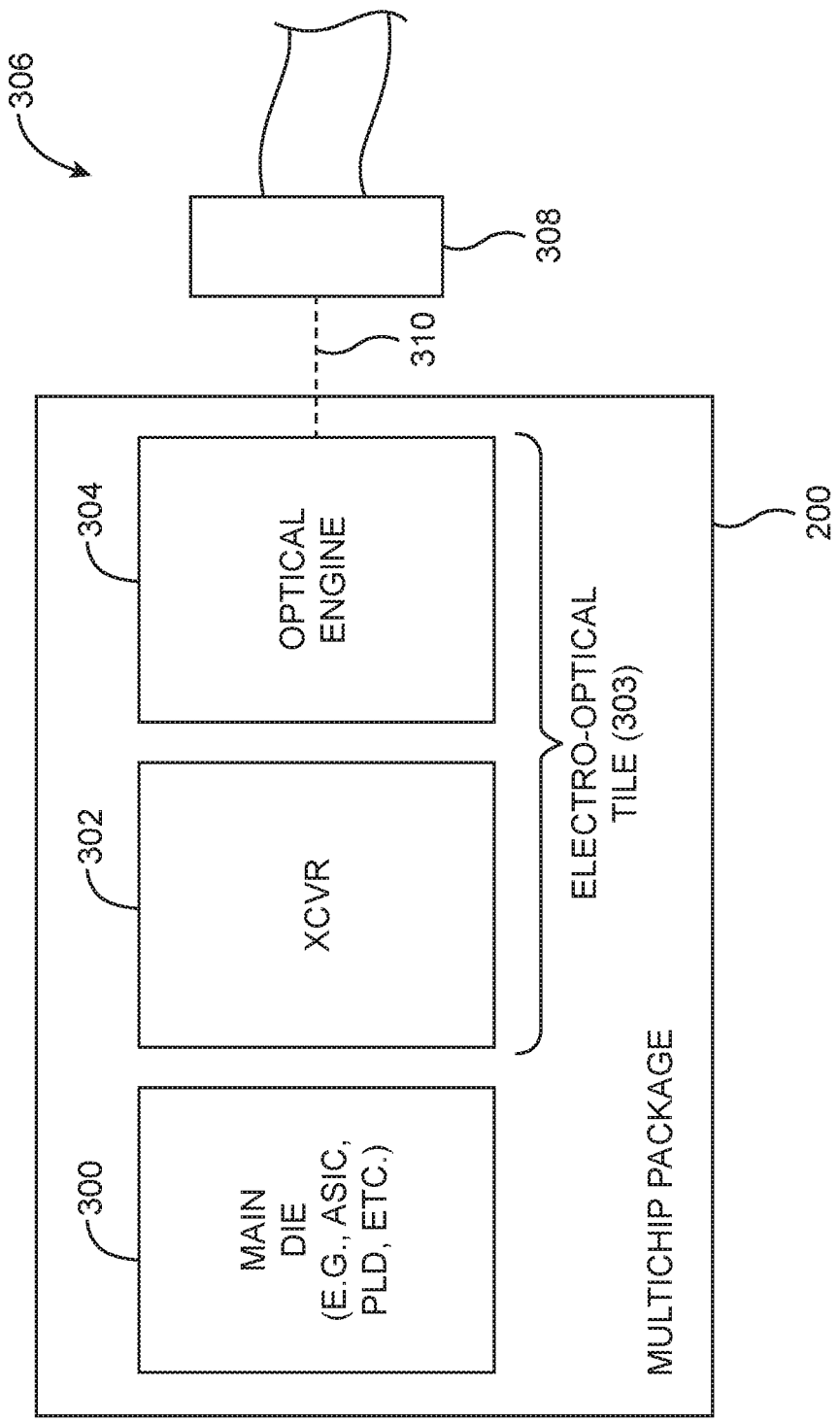
FIG. 3 is a diagram of an illustrative multichip package with a main die and an electro-optical tile in accordance with an embodiment.

In accordance with an embodiment, FIG. 3 shows how multichip package 200 may include a main die 300 and an electro-optical tile 303. Main die 300 may be any suitable integrated circuit such as application specific integrated circuits (ASICs), programmable logic devices, application specific standard products (ASSPs), or other integrated circuits that include core processing circuitry or processing/logic circuitry configured to carry out a user application/function. Electro-optical tile 303 may include a transceiver component 302 and an optical engine (OE) component 304. Transceiver component 302 may be configured to handle electrical signals (e.g., digital and analog signals), whereas optical component 304 may be configured to handle primarily optical signals. As a result, transceiver 302 and optical engine 304 may be referred to collectively as an "electro-optical" tile.

An external optical cable 306 may have a connector 308 configured to mate with optical engine component 304, as indicated by connection path 310. Mated in this way, external optical network signals can be fed directly to and from multichip package 200. By forming the optical engine component 304 directly on multichip package 200, interconnects between main die 300 and component 304 can be optimized for low power and high bandwidth density, which can help substantially reduce power consumption in a high-performance computing system while maintaining interconnect speeds of greater than 10 Gbps, 40 Gbps, 100 Gbps, 400 Gbps, etc.

Figure 4:
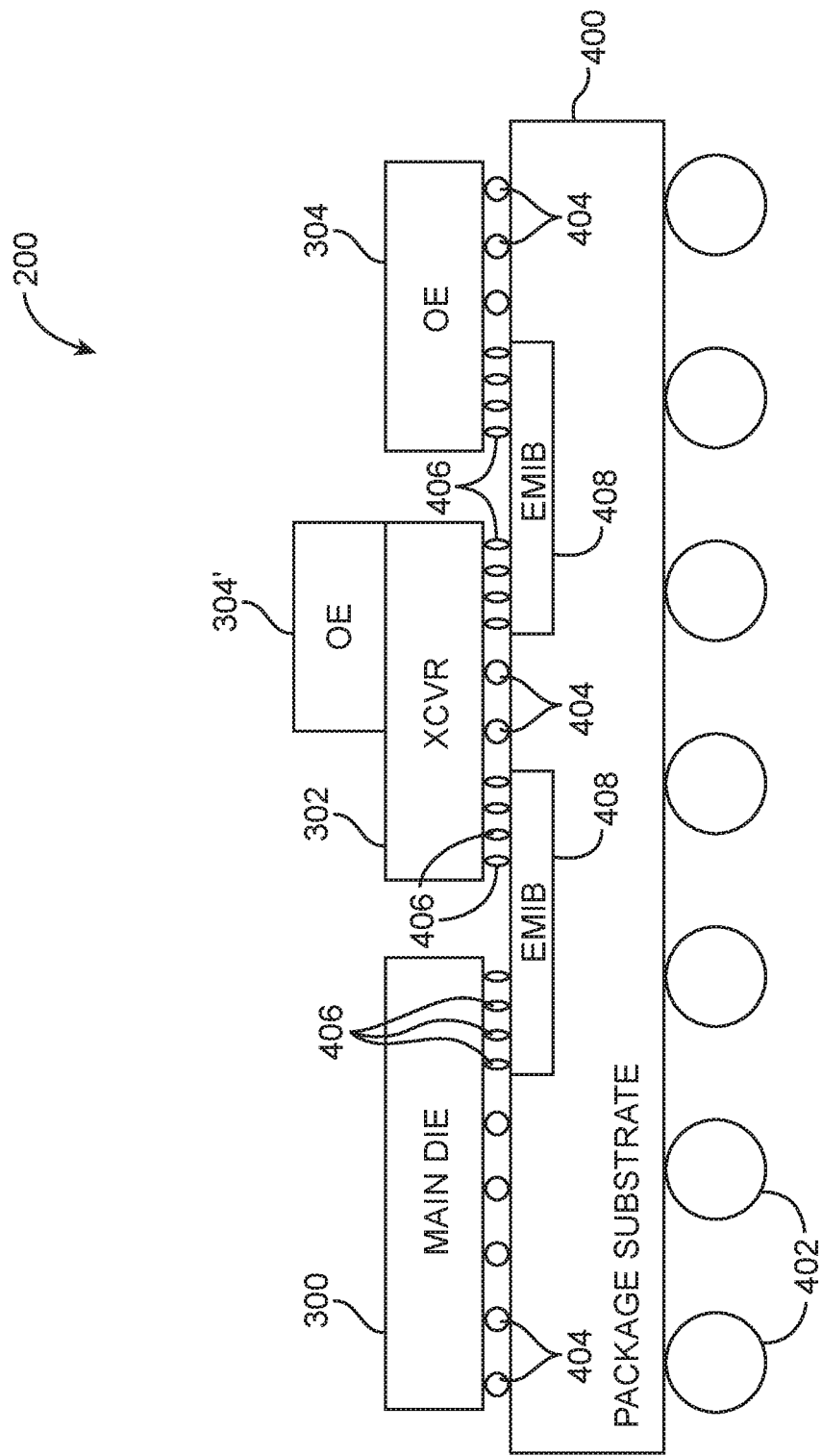
FIG. 4 is cross-sectional side view of an illustrative multiple package with a main die, a transceiver, and optical engine(s) in accordance with an embodiment.

FIG. 4 is cross-sectional side view of an illustrative multiple package 200 with main die 300, a transceiver die 302, and optical engine dies 304. As shown in FIG. 4, multichip package 200 may include a package substrate 400 with a top surface and a bottom surface, main die 300 mounted on the top surface of substrate 400, transceiver die 302 mounted on the top surface of substrate 400, and optical engine die 304 mounted on the top surface of substrate 400. An array of solder balls 402 (sometimes referred to collectively as a ball grid array or BGA) may be formed at the bottom surface of package substrate 400.

Main die 300, transceiver die 302, and optical engine die 304 may be mounted on package substrate 200 using solder bumps 404 (e.g., controlled collapse chip connection (C4) bumps) and microbumps 406. It should be noted that the pitch width of solder bumps 404 may be greater than the pitch width of microbumps 406, such that microbumps 406 have greater connectivity density than solder bumps 404. The diameter of microbumps 406 are also generally smaller than the diameter of C4 bumps 404 (e.g., bumps 406 may be at least two times smaller, at least four times smaller, etc.). Solder bumps 404 are also smaller than BGA solder balls 402.

In order to facilitate communications between two chips on multichip package 200, package 200 may include one or more embedded multi-die interconnect bridge (EMIB) components 408. An EMIB is a small silicon die that is embedded in package substrate 400 and that offers dedicated ultra-high-density interconnection between dies within package 200. EMIBs generally include wires of minimal length, which help to significantly reduce loading and directly boost performance without consuming large amounts of power.

EMIB solutions may be advantageous over other multi-chip packaging schemes that use a silicon interposer, which is prone to issues such as warpage and requires a comparatively large number of microbumps and through-silicon vias (TSVs) to be formed on and within the interposer, thereby reducing overall yield and increasing manufacturing complexity and cost. The number of dies that can be integrated using an interposer is also limited to that supported by EMIB technology.

The EMIB technology described above may be used as an interface between two or more integrated circuit dies in package 200. In the example of FIG. 4, main die 300 may be coupled to and convey signals to and from transceiver die 302 using a first EMIB 408 that is embedded in package substrate 400. In particular, main die 300 and transceiver die 302 interface with the first EMIB 408 using only microbumps 406, which supplies high density interconnectivity relative to C4 bumps 404. Similarly, transceiver 302 may be coupled to and convey signals to and from optical engine die 304 using a second EMIB 408 that is embedded in package substrate 400. Transceiver die 302 and optical engine die 304 also interface with the second EMIB 408 using only microbumps 406, which supplies high density interconnectivity compared to C4 bumps 404.

The exemplary multichip package stack-up of FIG. 4 is merely illustrative and does not serve to limit the scope of the present embodiments. If desired, multichip package 200 may include more than one transceiver die 302 coupled to main die 300 via respective EMIB components. If desired, one or more additional optical engine dies may be mounted on package substrate 400 or stacked on top of other dies (e.g., see additional optical engine die 304' stacked on top of transceiver die 302). As an example, multichip package 200 may include one main die 300 and four transceiver dies 302, two of which are coupled to one optical engine die 304 and another two of which are coupled to multiple optical engine dies 304.

Figure 5:
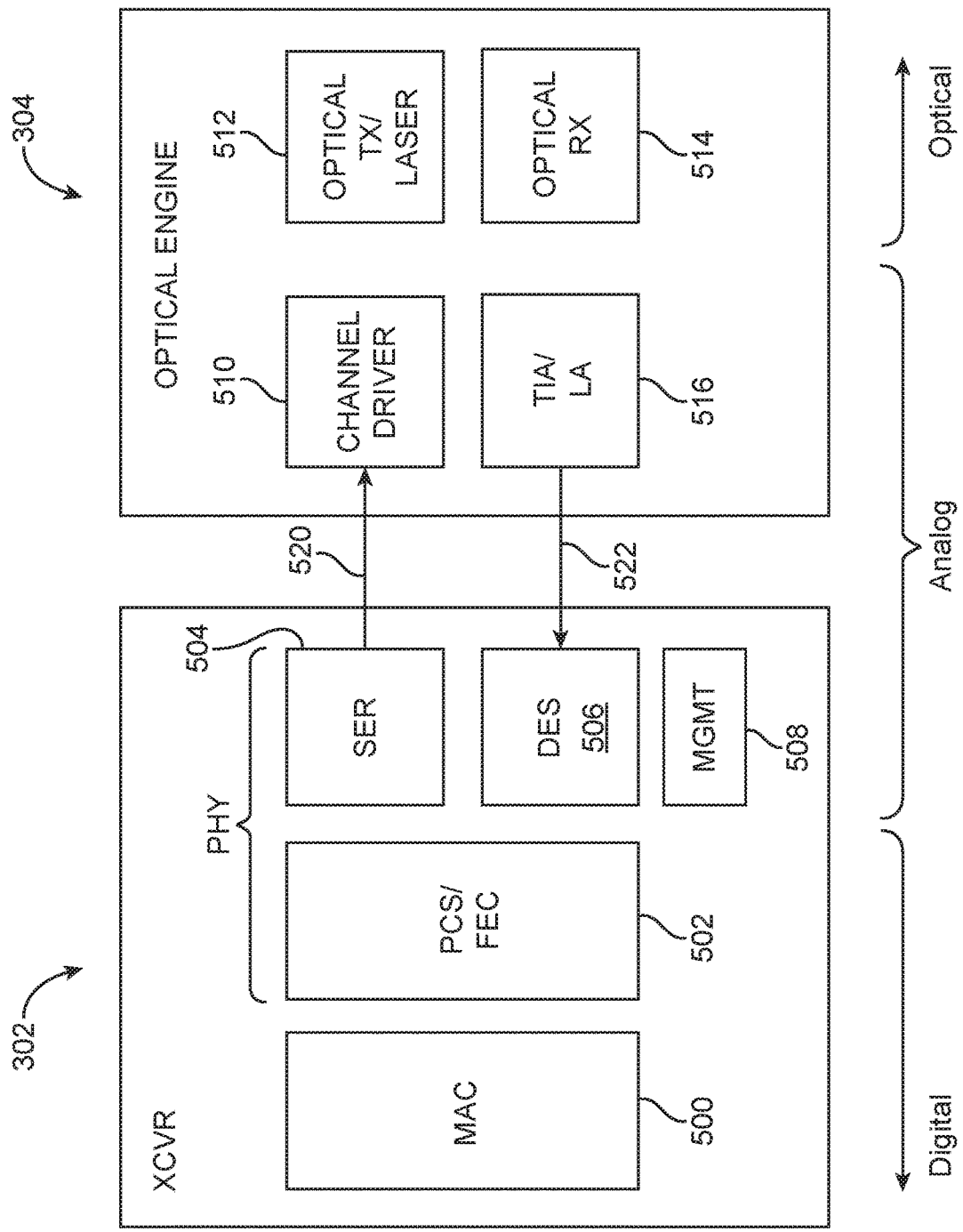
FIG. 5 is a diagram illustrating a transceiver physical layer directly driving an optical engine in accordance with an embodiment.

FIG. 5 is a diagram illustrating the interface between the transceiver die and the optical engine die within the multichip package. As shown in FIG. 5, transceiver 302 may include a physical-layer interface portion (oftentimes abbreviated as "PHY"), which connects the physical medium through which data is conveyed to and from transceiver die 302 to an associated protocol processing circuit 500.

The transceiver PHY may include a physical coding sublayer (PCS) and forward error correction (FEC) block 502, a serializer 504, a deserializer 506, a link management circuit 508, and/or other high-speed serial interface circuitry suitable for transmitting and receiving data. Block 502 may include, among others, decoders, encoders, data alignment circuitry, and registers such as first-in-first-out (FIFO) storage elements. Serializer 504 may be configured to transmit serialized data off of transceiver 302, whereas deserializer 506 may be configured to receive serialized data, deserialize the received data, and feed the deserialized data to block 502 for further processing. Management block 508 may be configured to control the operations of the transceiver PHY to ensure proper connection and data transfer.

Protocol processing circuit 500 may serve as a data link layer component that is used to provide address and channel access control mechanisms to support unicast, multicast, or broadcast communications services. Protocol processing circuit 500 that is used to support an Ethernet link is sometimes referred to as a media access controller (MAC). In general, protocol processing circuit 208 may be used as the interface between the transceiver PHY and the main die to support any type of network communications protocol.

Still referring to FIG. 5, optical engine 304 may include channel driver 510, optical transmitter and laser component 512, optical receiver 514, and transimpedance amplifier (TIA) and limiting amplifier (LA) component 516. Channel driver 510 may be driven directly by the transceiver PHY (e.g., serializer 504 may directly drive channel driver 510 via EMIB path 520). Channel driver 510 may then generate corresponding output signals to component 512 so that optical signals can be output from optical engine 304 to an optical cable. Optical receiver 514 may receive signals from the external optical cable and may feed corresponding signals to component 516. Component may then feed the received signals directly to the transceiver PHY (e.g., deserializer 506 may receive signals directly from optical engine 304 via EMIB path 522).

Blocks 500 and 502 are configured to process signals in the digital domain. Blocks 504 and 506 in the transceiver PHY and blocks 510 and 516 in the optical engine are configured to process signals in the analog domain. Blocks 512 and 514 are configured to process signals in the optical domain. Operated in this way, transceiver 302 and optical engine 304 are configured as an electro-optical tile that converts signals between the digital/electrical domain and the optical domain.

Figure 6:
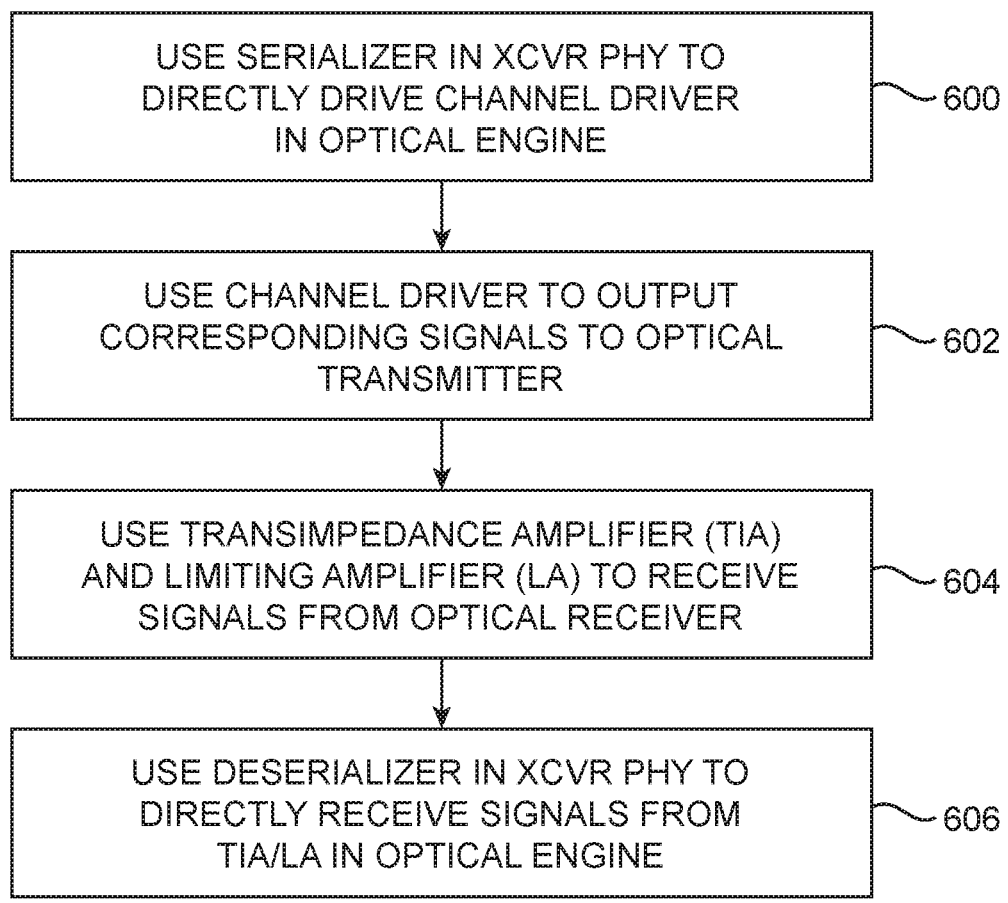
FIG. 6 is a flow chart of illustrative steps for operating a multichip package of the type shown in FIGS. 2-5 in accordance with an embodiment.

FIG. 6 is a flow chart of illustrative steps for operating a multichip package of the type shown in FIGS. 2-5. At step 600, serializer 504 in the transceiver PHY may directly drive channel driver 510 in the optical engine. At step 602, channel driver 510 may then output corresponding signals to optical transmitter 512. Optical transmitter 512 may then output signals via an external optical cable.

At step 604, transimpedance amplifier (TIA) and limiting amplifier (LA) block 516 may receive signals from optical receiver 514. At step 606, deserializer 506 in the transceiver PHY may directly receive signals from block 516 in the optical engine. Deserializer 506 may then feed deserialized signals to the main die via blocks 502 and 500.

These steps are merely illustrative and are not intended to limit the present embodiments. The existing steps may be modified or omitted; some of the steps may be performed in parallel; additional steps may be added; and the order of certain steps may be reversed or altered. If desired, other ways of using the transceiver to directly drive optical engine within the same package via an EMIB or other embedded high-density interconnect component may be used.

Figure 7:
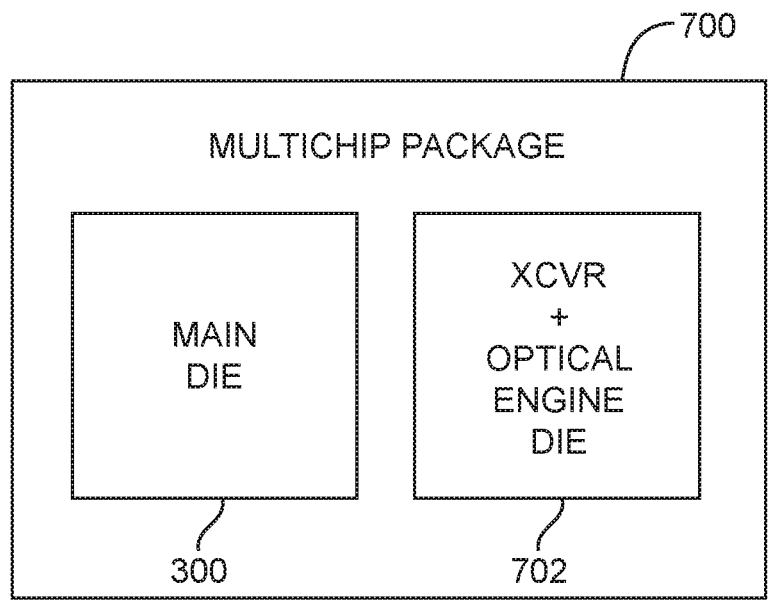
FIG. 7 is a diagram of an illustrative multichip package where the transceiver and the optical engine are formed on one die in accordance with an embodiment.

The embodiments described above in which the main die, transceiver, and optical engine are formed as part of different dies within a multichip package are merely illustrative. In another suitable embodiment (see, e.g., FIG. 7), multichip package 700 may include main die 300 and another die 702 that includes both the transceiver and optical engine circuits. In other words, the transceiver component and the optical engine component are collectively formed on a single auxiliary die 702 within package 700.

Figure 8:
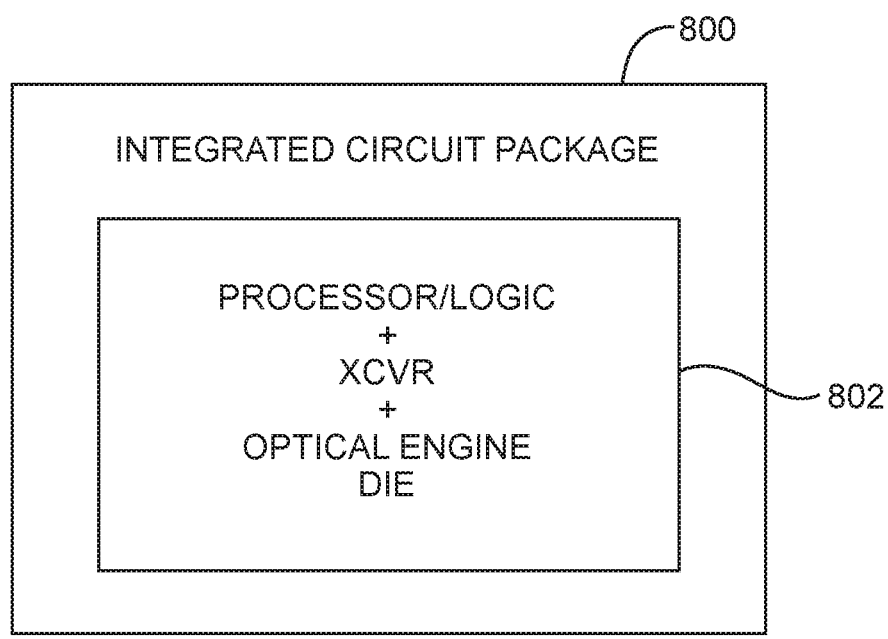
FIG. 8 is a diagram of an illustrative integrated circuit package where the main processing circuitry, transceiver, and optical engine are formed on one die in accordance with an embodiment.

In yet another suitable embodiment (see, e.g., FIG. 8), an integrated circuit package such as single-chip package 800 may include one die 802 that includes the main processing and logic circuitry, the transceiver, and optical engine. In other words, the processing circuitry of the main integrated circuit (e.g., circuitry of a PLD or ASIC), the transceiver component, and the optical engine component can all be collectively formed on a single die 802 within package 800. In general, these components can be formed in any number of dies within an integrated circuit package.

EXAMPLES

The following examples pertain to further embodiments.

Example 1 is an integrated circuit package, comprising: processing circuitry; and an optical engine coupled to the processing circuitry.

Example 2 is the integrated circuit package of example 1, wherein the optical engine is optionally coupled to an external optical cable configured to mate directly with the integrated circuit package.

Example 3 is the integrated circuit package of any one of examples 1-2, optionally further comprising a transceiver coupled to the processing circuitry.

Example 4 is the integrated circuit package of example 3, wherein the transceiver is optionally coupled between the processing circuitry and the optical engine.

Example 5 is the integrated circuit package of example 4, wherein the processing circuitry, the optical engine, and the transceiver are optionally all formed on separate dies within the integrated circuit package.

Example 6 is the integrated circuit package of example 4, wherein the optical engine and the transceiver are optionally formed on the same die within the integrated circuit package.

Example 7 is the integrated circuit package of example 4, wherein the processing circuitry, the optical engine, and the transceiver are optionally all formed on the same die within the integrated circuit package.

Example 8 is the integrated circuit package of example 4, wherein the transceiver comprises a transceiver physical-layer circuit, wherein the optical engine comprises a channel driver, and wherein the transceiver physical-layer circuit optionally directly drives the channel driver.

Example 9 is the integrated circuit package of example 8, wherein the transceiver physical-layer circuit optionally comprises: a serializer that directly drives the channel driver of the optical engine; and a deserializer that directly receives signals from a transimpedance amplifier and limiting amplifier block in the optical engine.

Example 10 is the integrated circuit package of example 1, optionally further comprising an additional optical engine mounted on top of the transceiver.

Example 11 is a method of operating a multichip package, wherein the multichip package comprises a main chip and an optical engine chip, the method comprising: with the main chip, sending signals to the optical engine chip; and with the optical engine chip, receiving the signals from the main chip and outputting corresponding optical signals to an external optical cable that is directly mated to the multichip package.

Example 12 is the method of example 11, wherein the multichip package further comprises a transceiver chip interposed between the main chip and the optical engine chip, the method optionally further comprising: with the transceiver chip, conveying signals between the main chip and the optical engine chip.

Example 13 is the method of example 12, optionally further comprising: with a physical-layer component in the transceiver chip, directly driving the optical engine chip.

Example 14 is the method of example 13, wherein directly driving the optical engine chip with the physical-layer component in the transceiver chip optionally comprises: with a serializer in the physical-layer component of the transceiver chip, directly driving a channel driver in the optical engine chip.

Example 15 is the method of example 14, wherein directly driving the optical engine chip with the physical-layer component in the transceiver chip optionally further comprises: with a deserializer in the physical-layer component of the transceiver chip, directly receiving signals from a transimpedance and limiting amplifier block in the optical engine chip.

Example 16 is an integrated circuit system, comprising: a package substrate; an integrated circuit formed on the package substrate; a transceiver formed on the package substrate; and an optical engine formed on the package substrate, wherein optical engine is configured to interface directly with an optical cable.

Example 17 is the integrated circuit system of example, wherein the transceiver optionally comprises: a media access controller; a physical coding sublayer and forward error correction block configured to receive signals from the media access controller; a serializer configured to receive signals from the physical coding sublayer and forward error correction block; and a deserialzer configured to output signals to the physical coding sublayer and forward error correction block.

Example 18 is the integrated circuit system of example 17, wherein the optical engine optionally comprises: a channel driver configured to be directly driven by the serializer; an optical transmitter configured to receive signals from the channel driver; an optical receiver; and an amplifier block configured to receive signals from the optical receiver, wherein the amplifier block is configured to directly drive the deserializer.

Example 19 is the integrated circuit system of any one of examples of claims 16-18, optionally further comprising: a first embedded multi-die interconnect bridge coupled between the integrated circuit and the transceiver; and a second embedded multi-die interconnect bridge coupled between the transceiver and the optical engine.

Example 20 is the integrated circuit system of example 19, wherein the integrated circuit is optionally configured to conduct signals to the package substrate via solder bumps, wherein the integrated circuit is optionally configured to conduct signals to the first embedded multi-die interconnect bridge only via microbumps, and wherein the microbumps are at least two times smaller than the solder bumps.

Example 21 is an integrated circuit package, comprising: first means for outputting electrical signals; and second means for receiving the electrical signals and outputting corresponding optical signals to an external optical cable that is directly mated to the integrated circuit package.

Example 22 is the integrated circuit package of example 21, optionally further comprising: third means for conveying signals between the first means and the second means.

Example 23 is the integrated circuit package of example 22, wherein the first, second and third means are optionally formed on separate integrated circuit dies.

Example 24 is the integrated circuit package of example 22, wherein the second and third means are optionally formed on the same integrated circuit die.

Example 25 is the integrated circuit package of example 22, wherein the first, second and third means are optionally formed on the same integrated circuit die.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit package, comprising:
    processing circuitry formed on a first die disposed on a substrate of the integrated circuit package;
    a transceiver formed on the first die or a second die disposed on the substrate of the integrated circuit package; and
    an optical engine formed on a third die disposed on the substrate of the integrated circuit package, wherein the optical engine is coupled to the processing circuitry via the transceiver, and wherein the transceiver directly drives a channel driver of the optical engine via an interconnect bridge in the substrate.

2. The integrated circuit package of claim 1, wherein the optical engine is coupled to an external optical cable configured to mate directly with the integrated circuit package.

3. The integrated circuit package of claim 1, wherein the transceiver is formed on the second die disposed on the substrate of the integrated circuit package.

4. The integrated circuit package of claim 1, wherein the transceiver comprises a transceiver physical-layer circuit, that directly drives the channel driver.

5. The integrated circuit package of claim 4, wherein the transceiver physical-layer circuit comprises:
    a serializer that directly drives the channel driver of the optical engine; and
    a deserializer that directly receives signals from a transimpedance amplifier and limiting amplifier block in the optical engine.

6. The integrated circuit package of claim 1, further comprising an additional optical engine mounted on top of the transceiver.

7. The integrated circuit package of claim 1, wherein the interconnect bridge is embedded in the substrate to connect the transceiver and the channel driver of the optical engine.

8. The integrated circuit package of claim 1, wherein the transceiver directly drives the channel driver of the optical engine using one or more analog signals transmitted via the interconnect bridge.

9. A method of operating a multichip package, wherein the multichip package comprises a main chip, an optical engine chip, and a transceiver chip, the method comprising:
with the main chip, sending digital signals to the transceiver chip;
with the transceiver chip, receiving the digital signals from the main chip and sending analog signals based on the digital signals to the optical engine chip; and
with the optical engine chip, receiving the analog signals from the transceiver chip and outputting corresponding optical signals to an external optical cable that is directly mated to the multichip package.

10. The method of claim 9, further comprising:
with a physical-layer component in the transceiver chip, directly driving the optical engine chip.

11. The method of claim 10, wherein directly driving the optical engine chip with the physical-layer component in the transceiver chip comprises:
with a serializer in the physical-layer component of the transceiver chip, directly driving a channel driver in the optical engine chip.

12. The method of claim 9, comprising:
with a deserializer in the physical-layer component of the transceiver chip, directly receiving signals from a transimpedance and limiting amplifier block in the optical engine chip.

13. The method of claim 9, wherein the transceiver chip sends the analog signals to the optical engine chip via an interconnect bridge embedded in a substrate on which the transceiver chip and the optical engine chip are disposed.

14. An integrated circuit system, comprising:
a package substrate;
an integrated circuit formed on the package substrate;
a transceiver formed on the package substrate; and
an optical engine formed on the package substrate, wherein the transceiver is configured to directly drive the optical engine using one or more analog signals transmitted from the transceiver to the optical engine via conductors embedded in the package substrate, and wherein the optical engine is configured to interface directly with an optical cable.

15. The integrated circuit system of claim 14, wherein the transceiver comprises:
a media access controller;
a physical coding sublayer and forward error correction block configured to receive signals from the media access controller;
a serializer configured to receive signals from the physical coding sublayer and forward error correction block; and
a deserializer configured to output signals to the physical coding sublayer and forward error correction block.

16. The integrated circuit system of claim 15, wherein the optical engine comprises:
a channel driver configured to be directly driven by the serializer;
an optical transmitter configured to receive signals from the channel driver;
an optical receiver; and
an amplifier block configured to receive signals from the optical receiver, wherein the amplifier block is configured to directly drive the deserializer.

17. The integrated circuit system of claim 14, further comprising:
a first embedded multi-die interconnect bridge coupled between the integrated circuit and the transceiver; and
a second embedded multi-die interconnect bridge coupled between the transceiver and the optical engine, wherein the second embedded multi-die interconnect bridge comprises the conductors.

18. The integrated circuit system of claim 17, wherein the integrated circuit is configured to conduct signals to the package substrate via solder bumps, wherein the integrated circuit is configured to conduct signals to the first embedded multi-die interconnect bridge only via microbumps, and wherein the microbumps are at least two times smaller than the solder bumps.

19. The system of claim 14, wherein the conductors embedded in the package substrate comprise an embedded multi-die interconnect bridge.

20. The system of claim 14, wherein the integrated circuit is configured to send one or more digital signals to the transceiver, wherein the transceiver is configured to generate the one or more analog signals based on the one or more digital signals.

* * * * *